(12) United States Patent
Nakamura et al.

(10) Patent No.: US 10,264,705 B2
(45) Date of Patent: Apr. 16, 2019

(54) POWER CONVERSION APPARATUS

(71) Applicant: Keihin Corporation, Tokyo (JP)

(72) Inventors: Kazuki Nakamura, Tochigi (JP);
Morifumi Shigemasa, Tochigi (JP);
Kenichi Sasaki, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 15/982,086

(22) Filed: May 17, 2018

(65) Prior Publication Data

US 2019/0014686 A1     Jan. 10, 2019

(30) Foreign Application Priority Data

Jul. 6, 2017   (JP) ................. 2017-132375

(51) Int. Cl.
*H05K 7/20*     (2006.01)
*H05K 5/02*     (2006.01)

(52) U.S. Cl.
CPC ....... *H05K 7/20272* (2013.01); *H05K 5/0217* (2013.01); *H05K 7/20927* (2013.01)

(58) Field of Classification Search
CPC ............. H01L 25/0657; H01L 21/4871; H01L 2225/06589; H01L 51/524; H01L 51/529; H01L 2924/00; H01L 23/40; H01L 23/4012; H01L 23/36; H01L 25/117; H01L 2225/1094; H01L 25/112; H01L 23/4006; H02G 15/013; H05K 5/0217; H05K 1/0272; H05K 7/20272; H05K 7/20927; H05K 9/0037; H05K 7/1432; H05K 5/0247; H05K 7/20872; H05K 7/20327; H05K 7/2089; F28D 2021/0028; F28D 9/0056

USPC ........ 363/141; 361/689, 699, 702, 704, 688, 361/698, 677, 831; 165/104.33, 80.2, 165/80.4, 104.22; 257/714; 174/15.1; 277/500, 572, 300, 402, 313, 314, 351,
(Continued)

(56) References Cited

U.S. PATENT DOCUMENTS 8,169,780 B2 * 5/2012 Yoshino ............. H05K 7/20927
165/104.33
9,888,617 B2 * 2/2018 Ishiyama ............ H01L 23/4006

FOREIGN PATENT DOCUMENTS

JP           2016-067096           4/2016

OTHER PUBLICATIONS

Decision to Grant a Patent, JP 2017-132375 dated May 30, 2018 with English translation, 4 pages.
(Continued)

*Primary Examiner* — Mandeep S Buttar
(74) *Attorney, Agent, or Firm* — Rankin, Hill & Clark LLP

(57) ABSTRACT

Provided is a power conversion apparatus that has a simple drain structure of coolers without increasing a size of the power conversion apparatus. The power conversion apparatus includes a housing equipped with a first cooler and a second cooler. One of the first and second coolers has a plurality of coolant openings. The other cooler is constituted by a plurality of members that are connected to each other. The housing includes a plurality of first sealing portions for sealing connecting portions of a plurality of connecting coolant passages that connect to the coolant openings, and second sealing portions for sealing connecting portions between the members. Each of the sealing portions has a first sealing member, a second sealing member, and a drain opening. The drain openings merge into a single drain exit.

5 Claims, 4 Drawing Sheets

(58) Field of Classification Search
USPC ....... 277/562, 612, 641, 648, 301, 321, 361,
277/382, 401, 594, 608, 628, 654
See application file for complete search history.

(56) References Cited

OTHER PUBLICATIONS

Gazette of Registered Patent (Reg. No. 6351804) issued Jul. 4, 2018 with partial English translation, 2 pages.

\* cited by examiner

… …

POWER CONVERSION APPARATUS

FIELD OF THE INVENTION

The present invention relates to an improvement to a power conversion apparatus.

BACKGROUND OF THE INVENTION

A power conversion apparatus is disposed, for example, between a battery and a motor such that the power conversion apparatus controls and supplies an electric power, which is stored in the battery, to the motor. Many child units (e.g., a power module, a reactor, and other units) in a power conversion apparatus, i.e., a PCU (power control unit), mounted in a hybrid vehicle and an electric vehicle generate heat, and performances of the child units may drop due to influences of the generated heat. Thus, the power conversion apparatus needs a cooling structure. A variety of such cooling technologies have been proposed (e.g., Patent Literature Document 1).

The power conversion apparatus disclosed in Patent Literature Document 1 includes a cooler on a casing. The cooler has a liquid inlet for receiving a cooling liquid, and a liquid outlet for discharging the cooling liquid. The cooling liquid flows and circulates through a plurality of connecting passages, which are connected to the liquid inlet and the liquid outlet. A connecting portion between the liquid inlet and the connecting passage(s) is sealed by a sealing part, and a connecting portion between the liquid outlet and the connecting passage(s) is sealed by a sealing part. Each of the sealing parts has a first sealing member for preventing the cooling liquid from leaking to the outside from the connecting portion concerned, a second sealing member for enclosing the first sealing member, and a drain passage provided between the first sealing member and the second sealing member. The drain passage is formed in the casing. The cooling liquid, which stays between the first sealing member and the second sealing member, flows through the drain passage and is discharged out of the casing from the drain exit.

In this structure, however, each of the sealing parts requires the drain passage and the drain exit to discharge the cooling liquid, which stays between the sealing members. As the number of the sealing parts increases, the number of the drain passages and the drain exits increases. This would increase the size of the casing. As a result, there is a concern that the power conversion apparatus may have a larger size.

Patent Literature Document 1: Japanese Patent Application Laid-Open Publication No. 2016-067096

SUMMARY OF THE INVENTION

An object of the present invention is to provide a technology that allows a drain of a cooler to have a simple structure, without increasing the size of a power conversion apparatus.

According to a first aspect of the present invention, there is provided a power conversion apparatus that includes a first cooler for cooling a power module (or power modules), a second cooler for cooling an electronic component (or electronic components), and a housing equipped with the first cooler and the second cooler, one of the first cooler and the second cooler has a first coolant opening for receiving a coolant and a second coolant opening for discharging the coolant, the other of the first cooler and the second cooler is constituted by a plurality of members that are connected to each other, the housing includes a plurality of connecting coolant passages for connecting to the first and second coolant openings, a plurality of first sealing portions for sealing connecting portions between the first and second coolant openings and the connecting coolant passages, and a second sealing portion for sealing a connecting portion between the members, each of the first sealing portions and the second sealing portion includes:

a first sealing member for preventing the coolant from leaking to outside from the connecting portion concerned;

a second sealing member situated in a same plane as the first sealing member such that the second sealing member surrounds the first sealing member; and a drain opening between the first sealing member and the second sealing member for discharging the coolant that stays between the first sealing member and the second sealing member, and the drain openings of the first sealing portions and the second sealing portion are provided in the housing and merge into a single drain exit for discharging the coolant to the outside.

According to a second aspect of the present invention, the drain openings are connected to each other by a drain merging portion.

According to a third aspect of the present invention, the drain openings of the first sealing portions are connected to the drain opening of the second sealing portion by a plurality of drain passages, and each of the drain passages has a smaller diameter at a longitudinal center portion than at both ends of the drain passage concerned.

According to a fourth aspect of the present invention, the drain exit includes a first vertical passage that extends upward, a horizontal passage that extends in a generally horizontal direction from an upper end of the first vertical passage, and a second vertical passage that extends downward from a leading end of the horizontal passage and opens to the outside.

According to a fifth aspect of the present invention, a coolant inlet for introducing the coolant into the housing, a coolant outlet for discharging the coolant from the housing and the drain exit are formed in a same surface of the housing.

According to the first aspect of the present invention, all of the drain openings are concentrated in the single drain exit provided in the housing. Because there is provided a sole drain exit, it is possible to reduce the size of the housing. Also, the coolers can have a simple drain structure because the drain structure is obtained by simply concentrating all of the drain openings to the single drain exit. Thus, the drain structure of the coolers can have a simple structure without increasing the size of the power conversion apparatus.

Furthermore, even if water comes to the drain exit from the outside, there is the sole drain exit. Thus, it is difficult for the water to enter the inside from the drain exit, as compared to a configuration that has many drain exits. As a result, the waterproof property of the power conversion apparatus is enhanced.

According to the second aspect of the present invention, all of the drain openings are connected to each other by the drain merging portion, and therefore all of the drain openings merge into the single drain exit. Accordingly, it is possible to simplify the structure for causing the drain openings to merge into the single drain exit, as compared to a case in which all of the drain openings are individually connected to the single drain exit. For example, it is not necessary to provide, in the housing, a plurality of passages that extend to the single drain exit from each of the drain openings. Consequently, it is possible to reduce machining works for making horizontal holes and use of ball plugs, which would otherwise be required to provide a plurality of passages. In addition, it is possible to further reduce the size of the housing.

According to the third aspect of the present invention, the drain passage has a smaller diameter at the longitudinal center portion of the drain passage than at both ends of the drain passage. Thus, even if water comes to the drain exit from outside, it is difficult for the water to flow from one end of the drain passage to the opposite end of the drain passage. Because the water hardly flows back from the drain exit to the inside, it is possible to further enhance the waterproof property.

According to the fourth aspect of the present invention, the drain exit has a generally maze structure (the drain exit has complicated passages), which is made by the first vertical passage, the horizontal passage and the second vertical passage. Accordingly, even if water comes to the drain exit from the outside, it is difficult for the water to flow back from the drain exit to the inside. As a result, it is possible to further enhance the waterproof property of the power conversion apparatus.

According to the fifth aspect of the present invention, the single drain exit into which the drain openings merge is formed in the same surface of the housing as the coolant inlet and the coolant outlet. Thus, when an operator inspects the power conversion apparatus, the operator can look at the three openings simultaneously. In addition, if the coolant is leaking, the operator can quickly and certainly confirm that the coolant is leaking from at least one of the sealing portions as the operator looks at the sole drain exit. Thus, it is possible to facilitate the maintenance work to be conducted to the power conversion apparatus.

DETAILED DESCRIPTION OF THE PREFERRED EMBODIMENTS

Hereinafter, an embodiment for implementing the present invention will be described with reference to the accompanying drawings.

Figure 1:
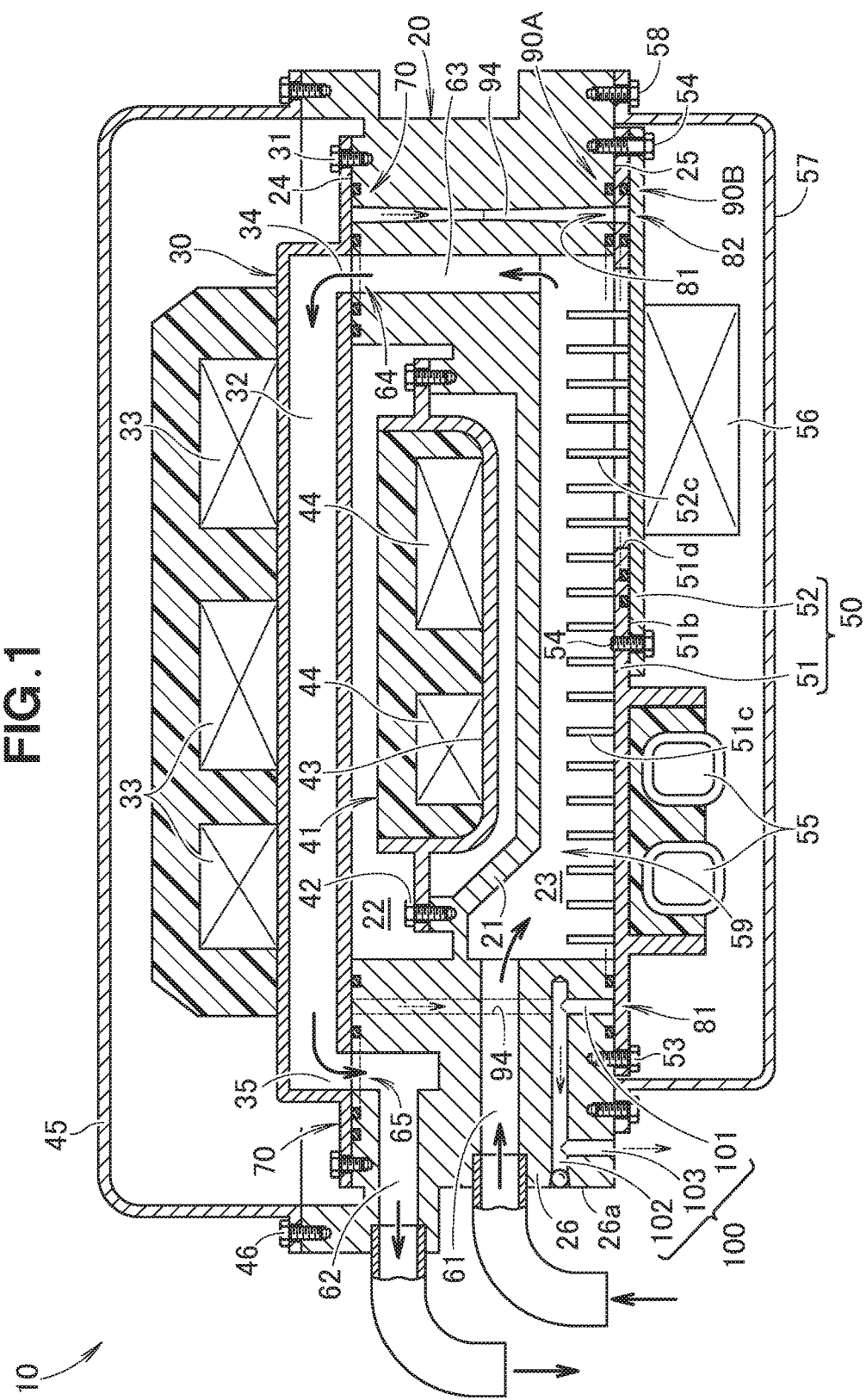
FIG. 1 is a schematic cross-sectional view of a power conversion apparatus according to an embodiment of the present invention.
Figure 2:
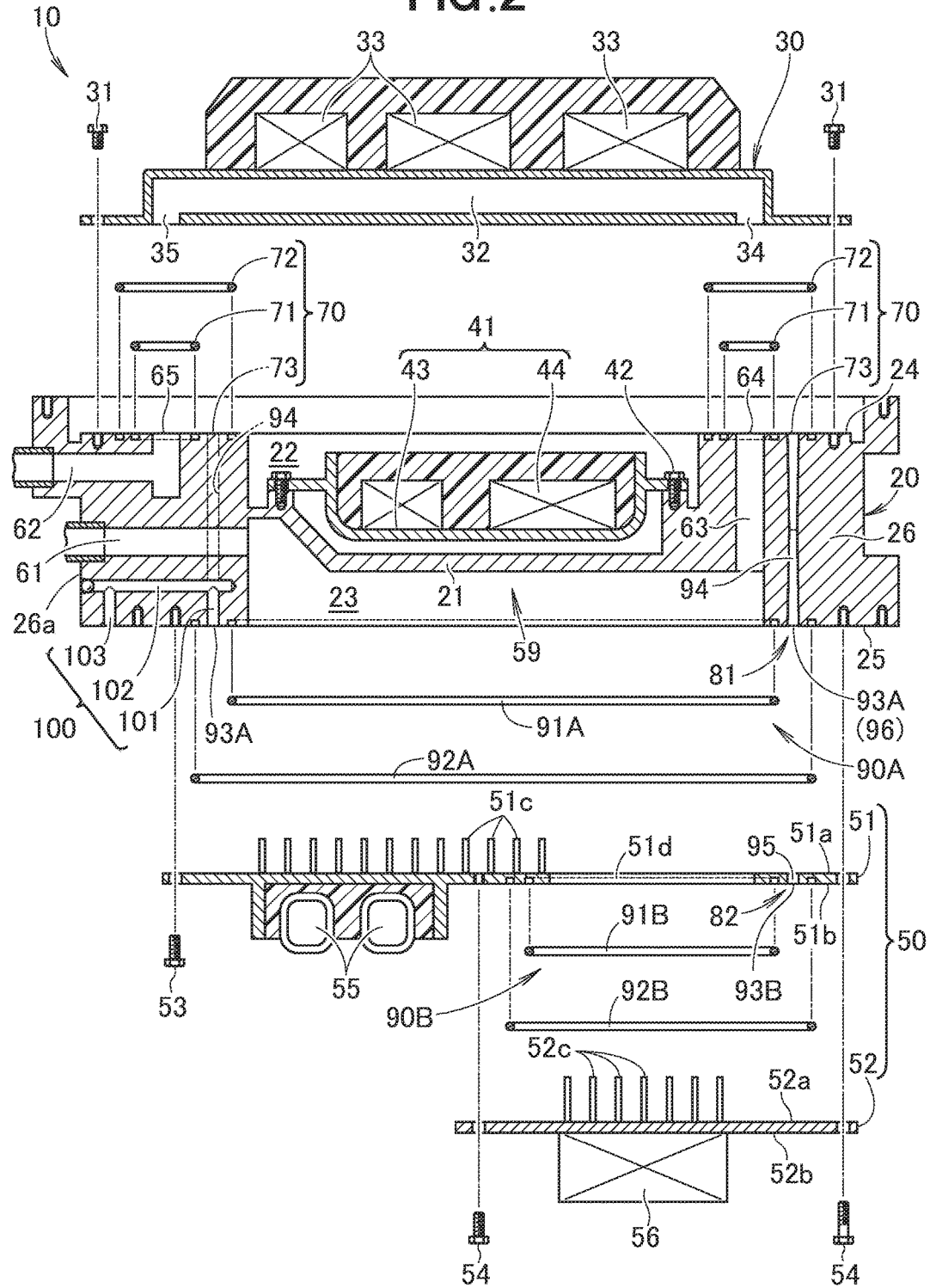
FIG. 2 is an exploded view of the power conversion apparatus shown in FIG. 1.

As shown in FIG. 1 and FIG. 2, a power conversion apparatus 10 includes a housing 20. The housing 20 has a generally rectangular shape when viewed from the top. The housing 20 is equipped with a first cooler 30 for cooling power modules 33 and a second cooler 59 for cooling electronic components 55 and 56. The power conversion apparatus 10 will be described in detail below.

The housing 20 is divided into a first chamber 22 and a second chamber 23 by a separation plate (partition plate) 21, which is integral with the housing 20. For example, the first chamber 22 is situated immediately above the second chamber 23.

The first chamber 22 is open at a side opposite the separation plate 21 (the first chamber is open in the upper portion thereof). The housing 20 has a flat seating surface 24 along an edge of the open end (upper opening) of the first chamber 22. The first cooler 30 is mounted on the seating surface 24. In other words, the open end of the first chamber 22, which is opposite the separation plate 21, is closed by the first cooler 30. As such, the first cooler 30 is mounted on the housing 20 and closes the open end (open face) of the first chamber 22.

Specifically, the first cooler 30 is a coolant jacket made by a separate member, independent of the housing 20. The first cooler 30 is a generally flat member and attached to the first chamber 22 with bolts 31 such that the first cooler 30 is detachable from the first chamber 22. The first cooler 30 has a coolant passage 32 therein. The coolant passage 32 is formed in the first cooler 30 to cool the power modules 33. The power modules 33 are mounted on an outer surface of the first cooler 30. Because the first cooler 30 is constituted by the coolant jacket, it is easy to assemble the first cooler 30 on the housing 20, and to mount the power modules 33 on the first cooler 30.

A first child unit 41 is received in the first chamber 22. The first child unit 41 includes a base member 43, which is attached to the separation plate 21 with bolts 42 in a detachable manner, and electronic components 44 (e.g., a smoothing capacitor, a reactor, a DC-DC convertor, a discharge resistor, and the like) mounted on the base member 43. The first cooler 30 and the power modules 33 are covered by a first cover 45. The first cover 45 is attached to the housing with bolts 46 such that the first cover 45 is detachable from the housing.

The second chamber 23 is defined by a groove portion that is open at a side opposite the separation plate 21 (the groove portion is open in a lower portion thereof). The housing 20 has a flat seating surface 25 along an edge of the open end (opening) of the second chamber 23. A lid 50 is mounted on the seating surface 25. In other words, the open end of the second chamber 23, which is opposite the separation plate 21, is closed by the lid 50. As such, the lid 50 is mounted on the housing 20 and closes the open end (open face) of the second chamber 23.

The lid 50 has a first lid portion 51 and a second lid portion 52. The first lid portion 51 is a flat plate that is laid over the seating surface 25 of the second chamber 23 and attached thereto with bolts 53 in a detachable manner. A surface of the first lid portion 51, which faces the separation plate 21, is referred to as a first facing surface 51a, and another surface, which is opposite the first facing surface 51a, is referred to as a mounting surface 51b. A plurality of cooling fins 51c are provided on the first facing surface 51a such that the cooling fins extend into the second chamber 23. A through hole 51d is formed at a certain portion of the first lid portion 51.

The second lid portion 52 is a flat plate that is laid over the mounting surface 51b of the first lid portion 51 and attached thereto with bolts 54 in a detachable manner in order to close the through hole 51d of the first lid portion 51. It should be noted that the second lid portion 52 may screwed onto the housing 20 together with the first lid portion 51 with some of the bolts 54. A surface of the second lid portion 52, which faces the mounting surface 51*b* of the first lid portion 51, is referred to as a second facing surface 52*a*, and another surface, which is opposite the second facing surface 52*a*, is referred to as a mounting surface 52*b*. A plurality of cooling fins 52*c* are provided on the second facing surface 52*a* such that the cooling fins extend into the second chamber 23.

The first electronic component 55 is mounted on the mounting surface 51*b* of the first lid portion 51. The second electronic component 56 is mounted on the mounting surface 52*b* of the second lid portion 52. Each of the first and second electronic components 55 and 56 include, for example, a smoothing capacitor, a reactor, a DC-DC convertor, a discharge resistor and the like.

In this manner, the separate lid portions 51 and 52 are united to a single plate and secured onto the housing 20. Thus, it is not necessary to open the second chamber 23 by the separate lid portions 51 and 52, respectively. This simplifies the structure of the power conversion apparatus 10. In addition, this increases the degree of integration of the respective electronic components 55 and 56, and freedom of arrangements of the electronic components 55 and 56. Because the electronic components 55 and 56 are mounted on the lid 50, it is possible to replace the electronic components 55 and 56 with new or different components by simply exchanging the lid 50. This enhances the usefulness of the power conversion apparatus 10. Because the lid 50 is made integral with the housing 20, it is possible to simplify the structure of the power conversion apparatus 10, and reduce the size of the power conversion apparatus 10.

The lid 50 and the electronic components 55 and 56 are covered by a second cover 57. The second cover 57 is attached to the housing 20 with bolts 58 in a detachable manner.

Walls of the housing 20 (including the separation plate 21), which define the second chamber 23, and the lid 50, which closes the second chamber 23, constitute the second cooler 59. The second cooler 59 is made by connecting a plurality of members 20 and 50 to each other, i.e., the second cooler 59 is made by connecting the housing 20 and the lid 50 to each other. As such, the second cooler 59 is a coolant jacket, at least part of which is integrally constituted with the housing 20. In the following description, the second chamber 23 may occasionally be referred to as "coolant passage 23."

The housing 20 has a plurality of connecting coolant passages 61-63 therein. Specifically, the housing 20 houses (contains) a first connecting coolant passage 61 (coolant inlet 61) for introducing the coolant into the housing 20 from the outside, a second connecting coolant passage 62 (coolant outlet 62) for discharging the coolant to the outside from the housing 20, and a third connecting coolant passage 63 for connecting the first cooler 30 with the second cooler 59.

The first connecting coolant passage 61 and the second connecting coolant passage 62 are formed in the same surface 26*a* of the side wall 26 of the housing 20, and are situated opposite the third connecting coolant passage 63.

The first cooler 30 has a coolant opening 34 (coolant receiving opening 34) for receiving the coolant from the third connecting coolant passage 63, and another coolant opening 35 (coolant discharging opening 35) for discharging the coolant to the second connecting coolant passage 62. The coolant receiving opening 34 and the coolant discharging opening 35 communicate with the coolant passage 32 of the first cooler 30. A first connecting portion 64 between the coolant introducing opening 34 of the first cooler 30 and the third connecting coolant passage 63, and a second connecting portion 65 between the coolant discharging opening 35 of the first cooler 30 and the second connecting coolant passage 62 are both the seating surface 24 of the first chamber 22.

The coolant (e.g., cooling water) supplied from the first connecting coolant passage 61 flows through the second cooler 59, the third connecting coolant passage 63 and the first cooler 30, and exits from the second connecting coolant passage 62. The coolant that flows through the coolant passage 32 directly cools the power modules 33 via (by means of) the first cooler 30. The coolant that flows through the second cooler 59 directly cools the electronic components 55 and 56 via the cooling fins 51*c* and 52*c* and the lid 50. Therefore, it is possible to directly and efficiently cool the power modules 33 and the electronic components 55 and 56.

Figure 3:
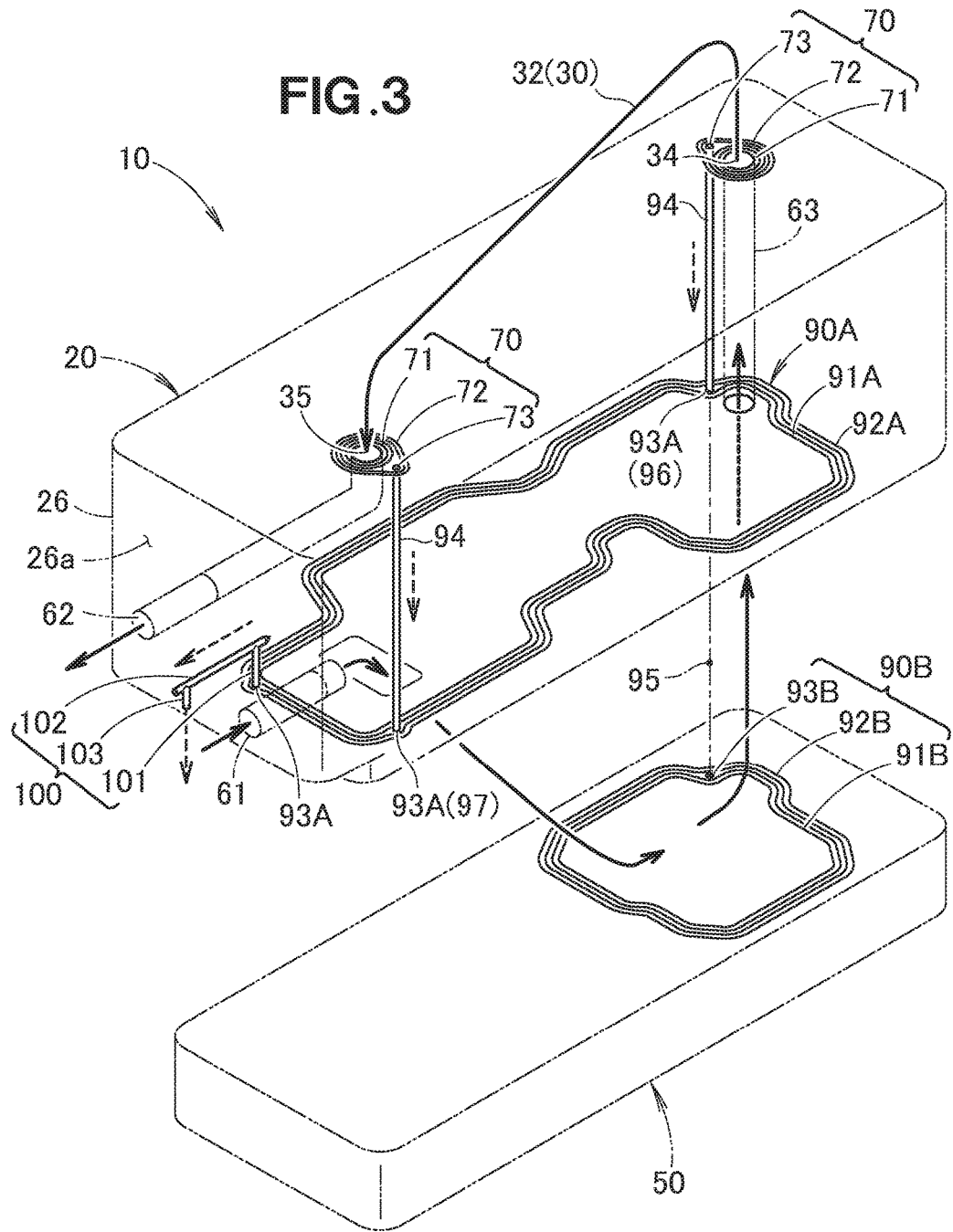
FIG. 3 is a perspective view of a plurality of sealing portions shown in FIG. 1 and their neighboring elements.
Figure 4A:
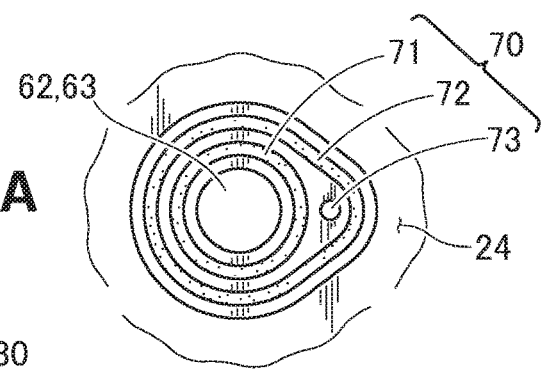
FIG. 4(a) is a detailed view to show a structure of the sealing portion shown in FIG. 1 when viewed from the top.

As shown in FIG. 1 to FIG. 3, FIG. 4(*a*) and FIG. 4(*b*), the first connecting portion 64 and the second connecting portion 65 are individually sealed by first sealing portions 70 and 70, respectively. The first sealing portions 70 and 70 are provided in the housing 20. Each of the first sealing portions 70 and 70 has a first sealing member 71, a second sealing member 72, and a drain opening 73.

The first sealing members 71 and 71 are situated on the seating surface 24 of the first chamber 22 to prevent the coolant from leaking to the outside from the first and second connecting portions 64 and 65. The second sealing members 72 and 72 are situated in the same plane as the first sealing members 71 and 71, i.e., the second sealing members 72 and 72 are situated on the seating surface 24 of the first chamber 22, to surround the first sealing members 71 and 71. Each of the first sealing members 71 and 71 and the second sealing members 72 and 72 includes, for example, an O-ring. The drain openings 73 and 73 are openings that can discharge the coolant, which stays between the first sealing members 71 and 71 and the second sealing members 72 and 72 when the coolant leaks from the first sealing members 71 and 71 for a certain reason. The drain openings 73 and 73 are present in the same plane as the first sealing members 71 and 71, i.e., the drain openings are present in the seating surface 24 of the first chamber 22.

As shown in FIG. 1 to FIG. 3, FIG. 4(*a*) and FIG. 4(*b*), a third connecting portion 81 between the second cooler 59 and the first lid portion 51 is the seating surface 25 of the second chamber 23, and a fourth connecting portion 82 between the first lid portion 51 and the second lid portion 52 is the mounting surface 51*b* of the first lid portion 51. The connecting portions 81 and 82 between the members 20, 51 and 52 of the second cooler 59, i.e., the third connecting portion 81 and the fourth connecting portion 82, are individually sealed by second sealing portions 90A and 90B, respectively.

The two second sealing portions 90A and 90B are substantially provided in the housing 20. Specifically, one of the two second sealing portions 90A and 90B is referred to as a primary second sealing portion 90A and the other is referred to as a secondary second sealing portion 90B. The primary second sealing portion 90A seals between the seating surface 25 of the second chamber 23 and the first facing surface 51*a* of the first lid portion 51. The secondary second sealing portion 90B seals between the mounting surface 51*b* of the first lid portion 51 and the second facing surface 52*a* of the second lid portion 52.

The structures of the two second sealing portions 90A and 90B are substantially the same as the structures of the first sealing portions 70 and 70. Specifically, the primary second sealing portion 90A is provided in the housing 20, and includes a first sealing member 91A, a second sealing member 92A, and a drain opening 93A. The secondary second sealing portion 90B is provided in the first lid portion 51, and includes a first sealing member 91B, a second sealing member 92B, and a drain opening 93B.

The first sealing members 91A and 91B are situated on the seating surface 25 of the second chamber 23 or the mounting surface 51b of the first lid portion 51 to prevent the coolant from leaking to the outside from the third and fourth connecting portions 81 and 82. The second sealing members 92A and 92B are situated in the same plane as the first sealing members 91A and 91B, i.e., the second sealing members 92A and 92B are situated on the seating surface 25 of the second chamber 23 or the mounting surface 51b of the first lid portion 51, to surround the first sealing members 91A and 91B. Each of the first sealing members 91A and 91B and the second sealing members 92A and 92B includes, for example, an O-ring. The drain openings 93A and 93B are openings that can discharge the coolant, which stays between the first sealing members 91A and 91B and the second sealing members 92A and 92B when the coolant leaks from the first sealing members 91A and 91B for a certain reason. The drain openings 93A and 93B are present in the same plane as the first sealing members 91A and 91B, i.e., the drain openings are present in the seating surface 25 of the second chamber 23 or the mounting surface 51b of the first lid portion 51.

As shown in FIG. 1 to FIG. 3, the drain openings 73, 73, 93A and 93B merge into a single drain exit 100, which is provided in the housing 20 to discharge the coolant to the outside.

Specifically, the drain openings 73 and 73 of the first sealing portions 70 and 70 are connected to the drain openings 93A and 93B of the second sealing portion 90A and 90B by the drain passages 94, 94 and 95. The drain openings 73 and 73 of the first sealing portions 70 and 70 are connected to drain merging portions 96 and 97 of the primary second sealing portion 90A by the first drain passages 94 and 94, respectively. The drain opening 93B of the secondary second sealing portions 90B is connected to the drain merging portion 96 of the primary second sealing portion 90A by the second drain passage 95.

Each of the drain merging portions 96 and 97 is located between the first sealing members 91A and 91B and the second sealing members 92A and 92B. Also, the drain merging portions 96 and 97 are present in the same plane as the first sealing members 91A and 91B, i.e., the drain merging portions 96 and 97 are present in the seating surface 25 of the second chamber 23. As a result, the drain openings 73, 73, 93A and 93B are connected to each other by the drain merging portions 96 and 97. In this manner, all of the drain openings 73, 73, 93A and 93B merge into the single drain exit 100.

Therefore, it is possible to simplify the structure for collecting the drain openings into the single drain exit 100, as compared to a case in which all of the drain openings 73, 73, 93A and 93B are individually connected to the single drain exit 100. For example, it is not necessary to provide, in the housing 20, a plurality of passages that extend to the single drain exit 100 from each of the drain openings 73, 73, 93A and 93B. Accordingly, it is possible to reduce machining works for making horizontal holes and use of ball plugs, which would otherwise be required to provide a plurality of passages. In addition, it is possible to further reduce the size of the housing 20.

Figure 4B:
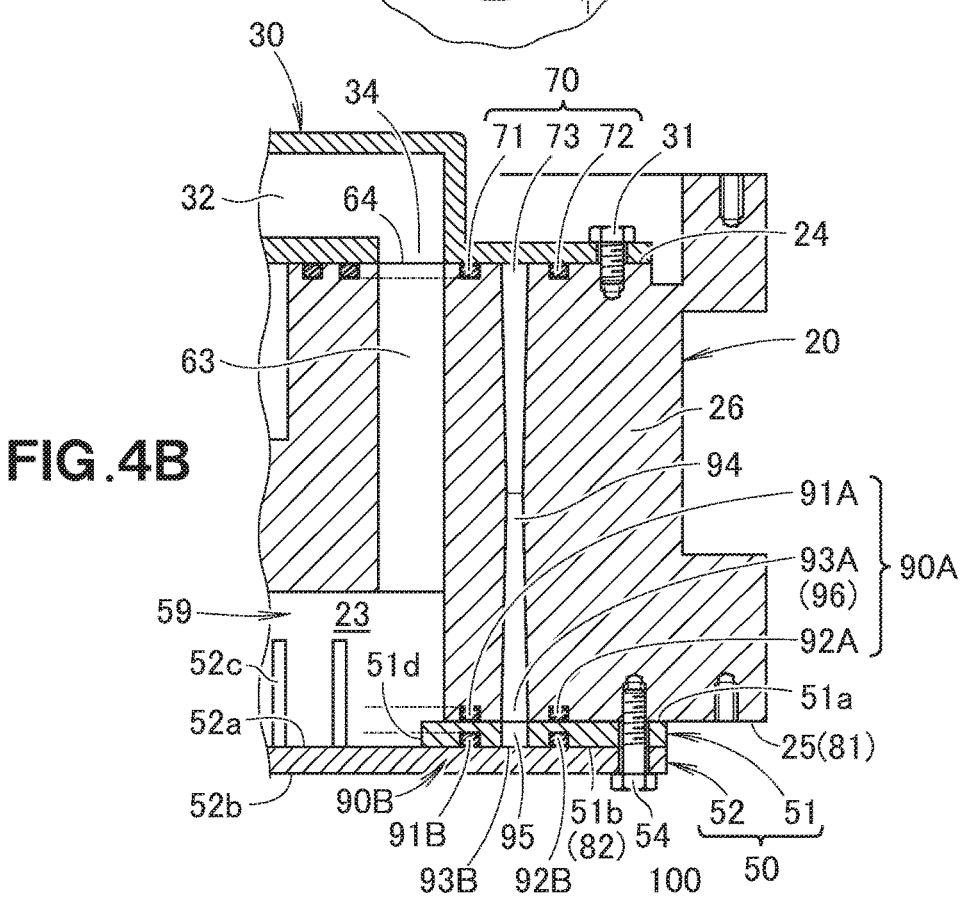
FIG. 4(b) is a detailed view to show a cross-sectional structure around a third drain passage shown in FIG. 1.

As shown in FIG. 4(b), at least one of the drain passages 94, 94 and 95 has a smaller diameter at a longitudinal center portion of the drain passage than at both ends of the drain passage. Thus, even if water comes to the drain exit 100 from outside, it is difficult for the water to flow from one end to the opposite end of the drain passage 94, 94, 95. Because the water hardly flows back from the drain exit 100 to the inside, it is possible to further enhance the waterproof property.

The drain exit 100 is situated between the first sealing member 91A and the second sealing member 92A of the primary second sealing portion 90A, and is present in the same plane as the first sealing member 91A, i.e., the drain exit 100 is present in the seating surface 25 of the second chamber 23. Accordingly, the drain openings 93A and 93B merge into the single drain exit 100.

Figure 4C:
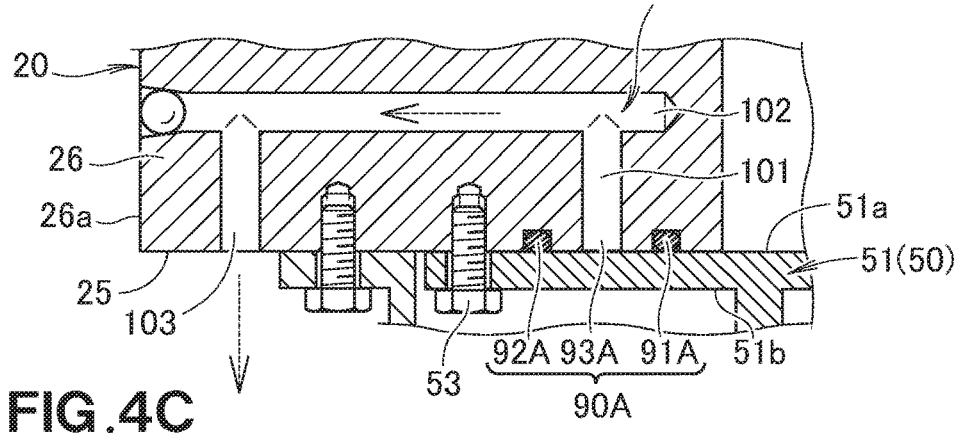
FIG. 4(c) is a detailed view to show a cross-sectional structure of a drain exit shown in FIG. 1.

As shown in FIG. 1, FIG. 3 and FIG. 4(c), the drain exit 100 includes, for example, a first vertical passage 101 that extends upward from the drain opening 93A between the first sealing member 91A and the second sealing member 92A of the primary second sealing portion 90A, a horizontal passage 102 that extends in a generally horizontal direction from an upper end of the first vertical passage 101, and a second vertical passage 103 that extends downward from a leading end of the horizontal passage 102 and opens to the outside. It is possible to discharge the leaking coolant to the outside from the second vertical passage 103. Thus, the drain exit 100 has a generally maze structure (the drain exit has complicated passages). Accordingly, even if water comes to the drain exit 100 from the outside, it is difficult for the water to flow back from the drain exit 100 to the inside. As a result, it is possible to further enhance the waterproof property of the power conversion apparatus 10.

As illustrated in FIG. 1 and FIG. 3, the coolant inlet 61 for supplying the coolant to the housing 20, the coolant outlet 62 for discharging the coolant, and the drain exit 100 are formed in the same surface 26a of the housing 20. Thus, when an operator inspects the power conversion apparatus 10, the operator can look at the three openings 61, 62 and 100 simultaneously. In addition, if the coolant is leaking, the operator can quickly and certainly confirm that the coolant is leaking from at least one of the sealing portions 70, 70, 90A and 90B by simply looking at the sole drain exit 100. Thus, it is possible to facilitate the maintenance work to be conducted to the power conversion apparatus 10.

For example, when the power conversion apparatus 10 is mounted in an engine compartment of a vehicle, the power conversion apparatus 10 can easily be placed at a position that allows a person to quickly find the drain exit 100 upon opening the engine compartment. Thus, it is possible for the person to quickly and certainly confirm the leakage of the coolant.

Because the coolant inlet 61, the coolant outlet 62 and the drain exit 100 are formed in the same surface 26a of the housing 20 and concentratedly located on one side, it is possible to reduce the size of the housing 20 (to achieve the downsizing). In addition, the housing 20 need not to have coolant piping on the opposite side, on which the coolant inlet 61 and the coolant outlet 62 are not provided. Thus, it is possible to reduce the installation space for installing the power conversion apparatus 10 and associated elements. Then, it is possible to install the power conversion apparatus 10 in a narrow space. This increases the freedom of the installation and arrangement. For example, when the power conversion apparatus 10 is mounted in the vehicle, this feature is effective in reducing the size of the vehicle.

The foregoing description can be summarized as follows: All of the drain openings 73, 73, 93A and 93B merge into (are concentrated to) the single drain exit 100 provided in the housing 20. Because the single drain exit 100 is sufficient, it is possible to reduce the size of the housing 20. Also, the first and second coolers 30 and 59 can have a simple drain structure because the drain structure is obtained by simply merging all of the drain openings 73, 73, 93A and 93B to the single drain exit 100. Thus, the drain structure of the first and second coolers 30 and 59 can have a simple structure without increasing the size of the power conversion apparatus 10.

Furthermore, even if water comes to the drain exit 100 from the outside, there is the sole drain exit 100. Thus, it is difficult for the water to enter the inside from the drain exit 100, as compared to a configuration that has many drain exits 100. As a result, the waterproof property of the power conversion apparatus 10 is enhanced.

It should be noted that the power conversion apparatus 10 may be mounted in an electric vehicle and a so-called hybrid vehicle, or may be used for a boat, a ship and general industry machinery.

The housing 20 is not limited to the structure that the housing 20 is separate from the first cooler 30, but the housing may be integral with the first cooler 30.

Also, the lid 50 is not limited to the structure that the lid 50 is divided into the first lid portion 51 and the second lid portion 52, but the lid 50 may only be constituted by the first lid portion 51 that has no through hole 51*d*.

Use of the first cover 45 and the second cover 57 shown in FIG. 1 is arbitrary.

INDUSTRIAL APPLICABILITY

The present invention is advantageously used for a power conversion apparatus mounted onto (or in) a vehicle.

REFERENCE NUMERALS

10 Power conversion apparatus
20 Housing
30 First cooler
33 Power module
34 Coolant opening (coolant receiving opening)
35 Coolant opening (coolant discharging opening)
50 Lid
55 Electronic component
56 Electronic component
59 Second cooler
61 First connecting coolant passage (coolant inlet)
62 Second connecting coolant passage (coolant outlet)
63 Third connecting coolant passage
64 First connecting portion
65 Second connecting portion
70 First sealing portion
71 First sealing member
72 Second sealing member
73 Drain opening
81 Connecting portion for a plurality of members (third connecting portion)
82 Connecting portion for a plurality of members (fourth connecting portion)
90A Second sealing portion (primary second sealing portion)
90B Second sealing portion (secondary second sealing portion)
91A, 91B First sealing members
92A, 92B Second sealing members
93A, 93B Drain openings
94 Drain passage
95 Drain passage
96 Drain merging portion
97 Drain merging portion
100 Drain exit
101 First vertical passage
102 Horizontal passage
103 Second vertical passage

What is claimed is:

1. A power conversion apparatus comprising:
   a first cooler for cooling a power module;
   a second cooler for cooling an electronic component; and
   a housing equipped with the first cooler and the second cooler,
   one of the first cooler and the second cooler having a first coolant opening for receiving a coolant and a second coolant opening for discharging the coolant,
   the other of the first cooler and the second cooler being constituted by a plurality of members that are connected to each other,
   the housing including a plurality of connecting coolant passages for connecting to the first and second coolant openings, a plurality of first sealing portions for sealing connecting portions between the first and second coolant openings and the plurality of connecting coolant passages, and a second sealing portion for sealing a connecting portion between the plurality of members,
   each of the plurality of first sealing portions and the second sealing portion including:
   a first sealing member for preventing the coolant from leaking to outside from the connecting portion concerned;
   a second sealing member situated in a same plane as the first sealing member such that the second sealing member surrounds the first sealing member; and
   a drain opening between the first sealing member and the second sealing member for discharging the coolant that stays between the first sealing member and the second sealing member,
   the drain openings of the plurality of first sealing portions and the second sealing portion being provided in the housing and merging into a single drain exit for discharging the coolant to the outside.

2. The power conversion apparatus according to claim 1, wherein the drain openings are connected to each other by a drain merging portion.

3. The power conversion apparatus according to claim 1, wherein the drain openings of the plurality of first sealing portions are connected to the drain opening of the second sealing portion by a plurality of drain passages, and
   each of the plurality of drain passages has a smaller diameter at a longitudinal center portion than at both ends of the drain passage concerned.

4. The power conversion apparatus according to claim 1, wherein the drain exit includes a first vertical passage that extends upward, a horizontal passage that extends in a generally horizontal direction from an upper end of the first vertical passage, and a second vertical passage that extends downward from a leading end of the horizontal passage and opens to the outside.

5. The power conversion apparatus according to claim 1, wherein a coolant inlet for introducing the coolant into the housing, a coolant outlet for discharging the coolant from the housing and the drain exit are formed in a same surface of the housing.

* * * * *